(12) United States Patent
Luich

(10) Patent No.: US 7,768,309 B2
(45) Date of Patent: Aug. 3, 2010

(54) LOW-NOISE PECL OUTPUT DRIVER

(76) Inventor: Thomas M. Luich, P.O. Box 731187, Puyallup, WA (US) 98373

( * ) Notice: Subject to any disclaimer, the term of this patent is extended or adjusted under 35 U.S.C. 154(b) by 0 days.

(21) Appl. No.: 11/949,621

(22) Filed: Dec. 3, 2007

(65) Prior Publication Data

US 2009/0140768 A1 Jun. 4, 2009

(51) Int. Cl.
*H03K 19/0175* (2006.01)
(52) U.S. Cl. ............... 326/81; 326/86; 326/126; 327/333
(58) Field of Classification Search .......... 326/63, 326/68, 73, 80–83, 86, 126; 333/167, 181; 327/108–109, 333
See application file for complete search history.

(56) References Cited

U.S. PATENT DOCUMENTS

| | | | | |
|---|---|---|---|---|
| 5,043,686 A | * | 8/1991 | Plunkett | 333/181 |
| 5,379,003 A | * | 1/1995 | Bizen | 331/117 R |
| 5,920,206 A | * | 7/1999 | Matsumoto | 326/126 |
| 6,556,061 B1 | * | 4/2003 | Chen et al. | 327/333 |
| 7,053,656 B2 | * | 5/2006 | Seo | 326/68 |
| 2005/0024088 A1 | * | 2/2005 | Lee | 326/81 |
| 2005/0189961 A1 | * | 9/2005 | Frans et al. | 326/30 |
| 2009/0002027 A1 | * | 1/2009 | Lee | 326/80 |

* cited by examiner

*Primary Examiner*—James H. Cho
*Assistant Examiner*—Jason Crawford

(57) ABSTRACT

An integrated circuit output driver is provided that exhibits improved performance and signal integrity. In one embodiment, the integrated circuit output driver is fabricated in a process having thin-gate MOS transistors and thick-gate MOS transistors and includes a predriver circuit, a level shifter circuit, and a driver circuit. The predriver circuit is formed predominantly of thin-gate transistors, and the driver circuit is formed predominantly of thick-gate transistors. In other embodiments, a low-pass power supply filter is provided. In still other embodiments, a voltage regulator circuit is provided, wherein an operating potential of at least one of the predriver circuit and the level shifter circuit is less than the specified supply voltage. In one embodiment, the voltage regulator circuit produces: i) a reduced internal supply voltage that is applied to the predriver circuit; and ii) an elevated ground voltage that is applied to the level shifter circuit.

22 Claims, 8 Drawing Sheets

LOW-NOISE PECL OUTPUT DRIVER

Emitter Coupled Logic (ECL) has historically been used for high performance systems due to its high frequency, low swing, and differential signal. As the name implies, ECL was originally created using bipolar technology, and its output characteristics are particularly well-suited for bipolar transistors. Generally, due to its high cost and power, it was only used for the highest performing systems. Early ECL systems used ground as the positive rail, and a negative voltage as the negative rail, while new systems generally use a positive voltage for the positive rail, and ground for the negative rail. This Positive-voltage ECL is generally referred to as PECL.

As IC technology has advanced, CMOS performance has increased rapidly, mainly due to transistor scaling. As transistors have scaled downward, their performance has increased, but their operating voltage has scaled downward in the same fashion. The typical CMOS I/O cell, or driver, operates rail-to-rail at a maximum frequency of about 200 MHz, although there are many instances of high performance systems using CMOS that have exceeded this performance. It is desirable for CMOS-based high performance systems to adopt the high performance I/O aspects of ECL. However, the power supply levels for these systems have not scaled at the same rate as CMOS transistors. High performance CMOS systems typically operate at a positive 3.3 V or more recently at 2.5 V.

High performance CMOS circuits generally are not able to interface to PECL or other logic standards where the system power supplies operate at voltages above the transistor voltage limitations. For example, 0.18 u CMOS transistors are typically limited to about 2V operating voltage, significantly lower than most system supplies. To mitigate the supply mismatch between systems and transistors, most fabrication facilities have employed dual gate oxide thickness processes that allow thick gate transistors with 3.3V capability, while maintaining the high performance, thin gate, low voltage transistor. The thicker gate transistor is then used as an interface to the high voltage board level supply, while the thin gate transistors are regulated on die to their required supply voltage.

The use of thick gate transistors as the interface between low voltage thin gate transistors and the system supply presents a problem for high output frequencies. In particular, the 3.3V capability of thick gate transistors implies a lower-performance gate length, typically 0.35 u. Therefore, for high voltage systems requiring thick gate transistors for interfacing, the upper frequency range becomes much more limited than a lower voltage system using thin gate transistors. Other problems, including driver size, power consumption and power supply noise, have also limited the performance of MOS output drivers.

Referring to FIG. 1, a diagram is shown of a known CMOS PECL driver with predriver and translator. Since the driver must drive large loads, predriver stages 101a, 101b are used connect smaller, high frequency internal devices to the output stage 110. The predrivers 101a, 101b are formed as chains of inverters that supply added drive from one stage to the next, amplifying load driving capability tip to the ability to drive the very large output stage. Additionally, as the internal circuits use thin gate transistors operating at a lower power supply, level translators 103a, 103b are used such that lower voltage internal circuits 105a, 105b can drive the predrivers.

The output stage 110 is the NMOS equivalent of a bipolar ECL gate. Differential input gates N1, N2 have their drains coupled through respective resistors R1 and R2 to VDD. Sources of the input gates N1, N2 are coupled to a current source I that is in turn coupled to ground. A differential signal (IN, INZ) drives the differential input gates N1, N2, whose drains drive output transistors (source followers) N3, N4. Drains of the output source followers are coupled to VDD.

The output transistors N3, N4 are terminated externally by 50 ohms (RTERM1, RTERM2) to a voltage VDD_2 equal to VDD−2V, which is the requirement for PECL/ECL. The output levels at O and IO, which are 180 degrees out of phase with each other, are set by the voltage at the output source follower's gate minus the threshold voltage Vt of the transistor. The high level (VOH) of any one side of the output occurs when the transistor of the differential pair is off. In that case, the gate of the output transistor associated with off transistor is at VDD, and the output voltage is therefore VDD−Vt. The transistor must then source 24 mA to the load. The low level (VOL) of any one side of the output occurs when the transistor of the differential pair is on. In that case, the gate of the output transistor associated with the on transistor is at VDD—the IR drop created by the current source and the resistor R1 or R2. The output voltage is therefore VDD−IR−Vt. Ideally, Vt would be about 800 mV or less. However, since the Vt of the source followers is generally greater than 800 mV, a lower Vt is required, which can be supplied by processes with having low Vt options. Note that all transistors in this case have terminal voltages (including bulk) that can equal the VDD of the system supply, implying the need for thick gate devices.

Alternatively, the output stage may use PMOS transistors as shown in FIG. 2. In this alternative, a PMOS differential pair P3, P4 is used, eliminating the need for low Vt transistors. In this case the gates of the PMOS transistors ire switched to voltages such that one transistor sources 24 mA (for VOH) to the load resistor, while the other supplies 4-8 mA to the load. Both currents are supplied by a current source made up of a current source I2 and transistors P1 and P2. The output levels are then determined by VDD−2V+IR of the load resistor, as follows:

$$VOH = VDD - 2V + 24\,ma * 50 = VDD - 800\,mV$$

$$VOL = VDD - 2V + 4\,ma * 50 = VDD - 1.8V$$

In this case, the output transistors P3, P4 can have high voltage across the gate to drain terminals if the external pin is brought to ground, requiring thick gate transistors. All of the transistors P1-P4 are therefore thick gate transistors.

A diagram of the translator 103 of FIG. 1 is shown in FIG. 3. An input signal INZ is applied to a two-stage inverter chain INV1, INV2 formed from thin-gate transistors and having a reduced supply voltage VDD_INTERNAL. First and second output branches are provided, each including a P transistors and an N transistor. A P transistor P31 has its source connected to VDD and its drain connected to the drain of an N transistor N31, which has its source connected to ground. A P transistor P32 has its source connected to VDD and its drain connected to the drain of an N transistor N32, which has its source connected to ground. The transistor N31 has its gate connected to the output of the first inverter stage INV1. The transistor N32 has its gate connected to the output of the second inverter stage INV2. The gates of the transistors P31 and P32 are cross-coupled. An output signal OUT is taken at the drain of the transistor N32. When INZ is HIGH, the transistor N31 is turned OFF and the transistor N32 is turned ON, connecting the output signal OUT to ground. The transistor P31 is turned ON, and the transistor P32 is turned OFF. When INZ is LOW, the transistor N31 is turned ON and the transistor N32 is turned OFF. The transistor P31 is turned OFF, and the transistor P32 is turned ON, connecting the output signal to VDD. The inverters INV1 and INV2 are formed by thin-gate transistors. All of the other transistors are thick-gate transistors.

Many high performance systems require low noise circuits. Noise can be seen as "jitter" on any edge in the output. Causes of jitter can be internal timing inaccuracies, phase noise, spurious frequencies found in the spectrum, etc. FIG. 4 shows an example of spurious tones (frequencies) found in the output spectrum of a known CMOS driver. The desired frequency is centered on the plot, and the spurious tones are found at offsets of ~20 and ~40 MHz. These spurious tones (spurs) supply unwanted energy at frequencies other than the desired frequency, causing jitter.

An integrated circuit output driver is provided that exhibits improved performance and signal integrity. In one embodiment, the integrated circuit output driver is fabricated in a process having thin-gate MOS transistors and thick-gate MOS transistors and includes a predriver circuit, a level shifter circuit, and a driver circuit. The predriver circuit is formed predominantly of thin-gate transistors, and the driver circuit is formed predominantly of thick-gate transistors. In other embodiments, a low-pass power supply filter is provided. In still other embodiments, a voltage regulator circuit is provided, wherein an operating potential of at least one of the predriver circuit and the level shifter circuit is less than the specified supply voltage. In one embodiment, the voltage regulator circuit produces: i) a reduced internal supply voltage that is applied to the predriver circuit; and ii) an elevated ground voltage that is applied to the level shifter circuit.

Other features and advantages will be understood upon reading and understanding the detailed description of exemplary embodiments, found herein below, in conjunction with reference to the drawings, a brief description of which is provided below.

There follows a more detailed description of the present invention. Those skilled in the art will realize that the following detailed description is illustrative only and is not intended to be in any way limiting. Other embodiments of the present invention will readily suggest themselves to such skilled persons having the benefit of this disclosure. Reference will now be made in detail to embodiments of the present invention as illustrated in the accompanying drawings. The same reference indicators will be used throughout the drawings and the following detailed description to refer to the same or like parts.

Figure 1:
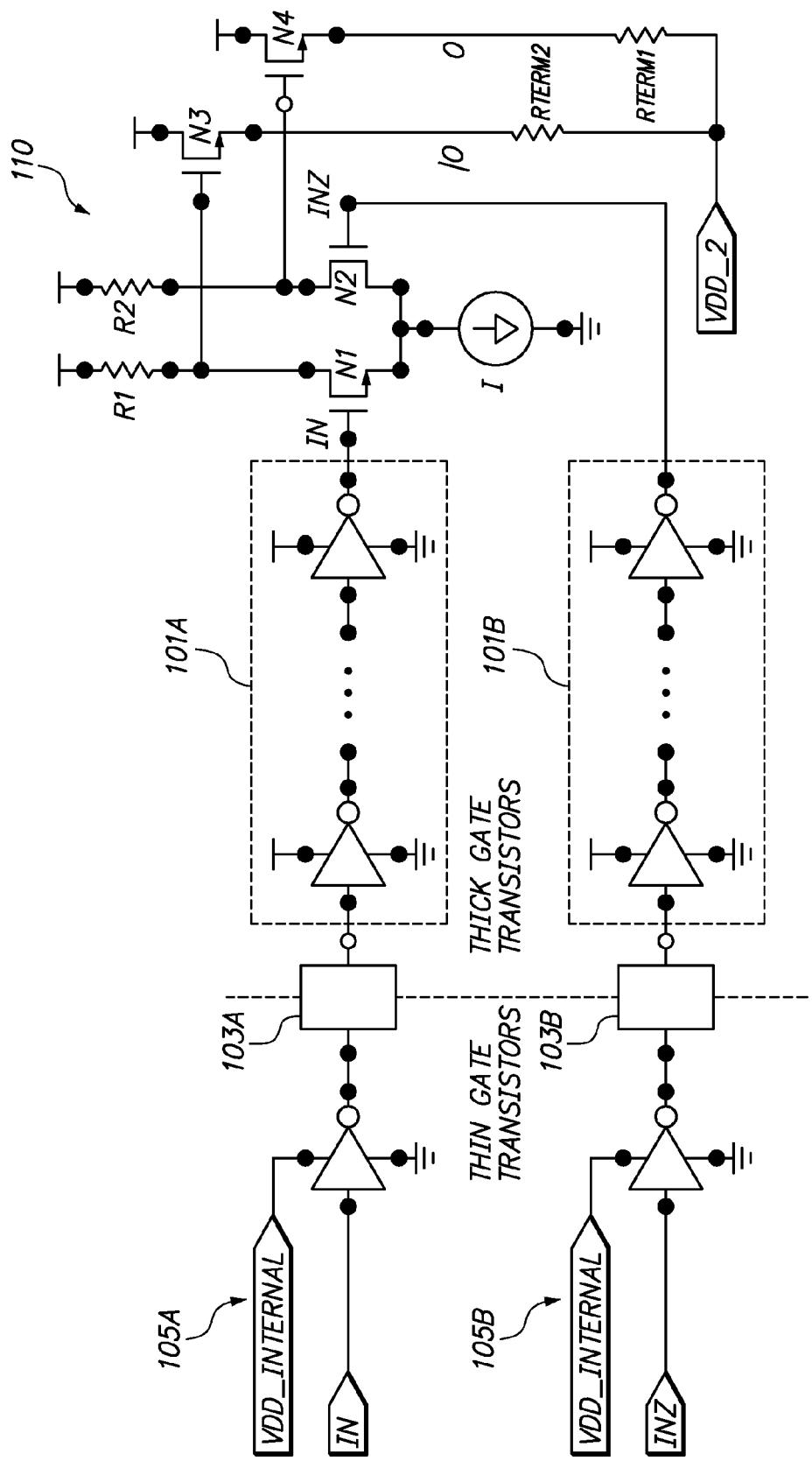
FIG. 1 is a diagram of a known PECL output driver.
Figure 2:
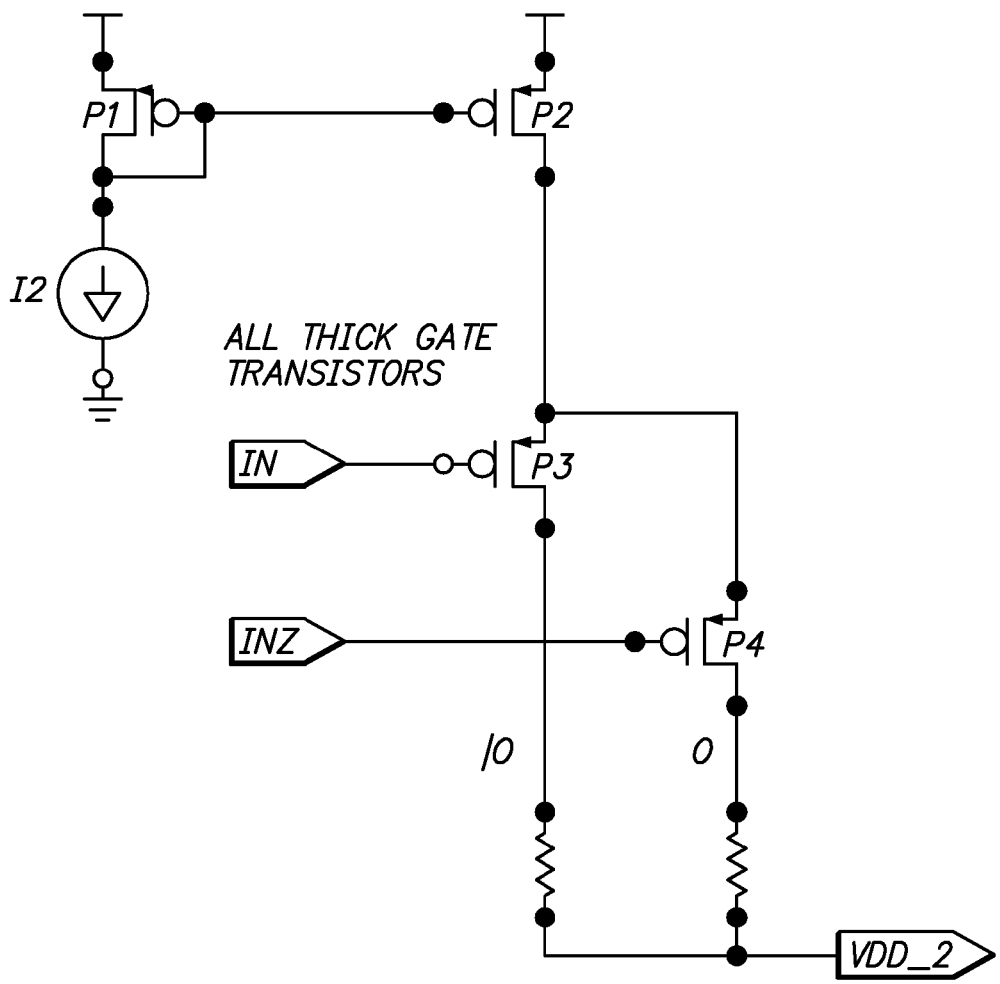
FIG. 2 is is a diagram of a known alternative output stage.
Figure 3:
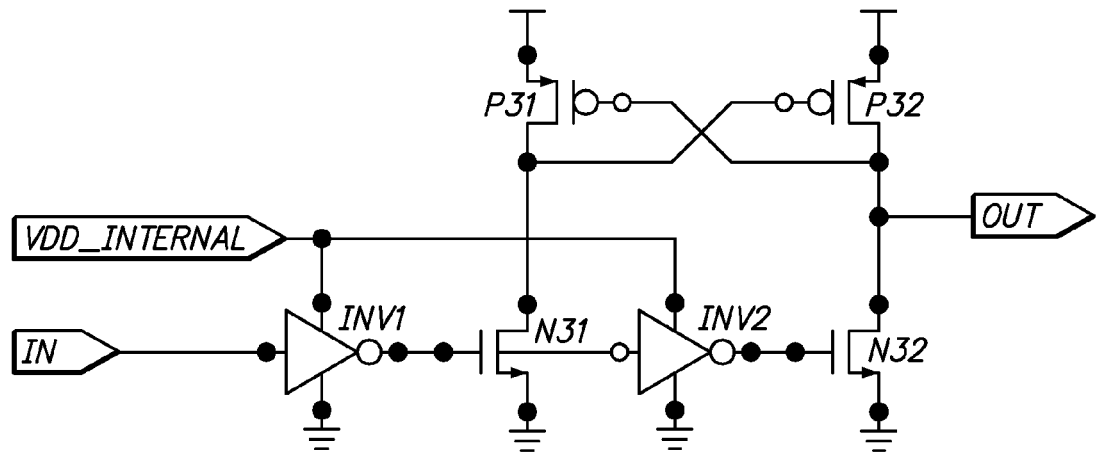
FIG. 3 is a diagram of the translator of FIG. 1.
Figure 4:
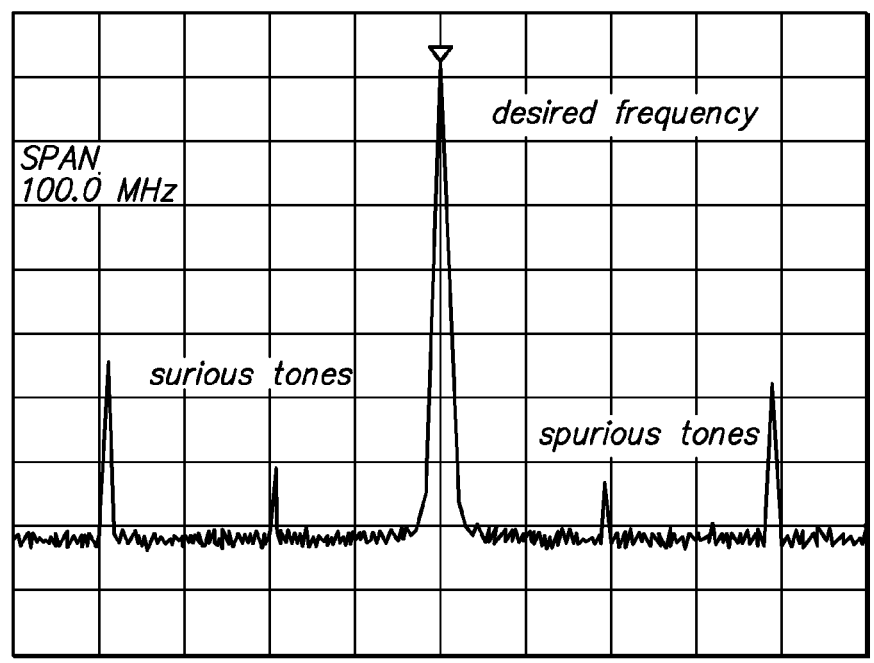
FIG. 4 is an output spectrum plot of a typical PECL output driver.
Figure 5:
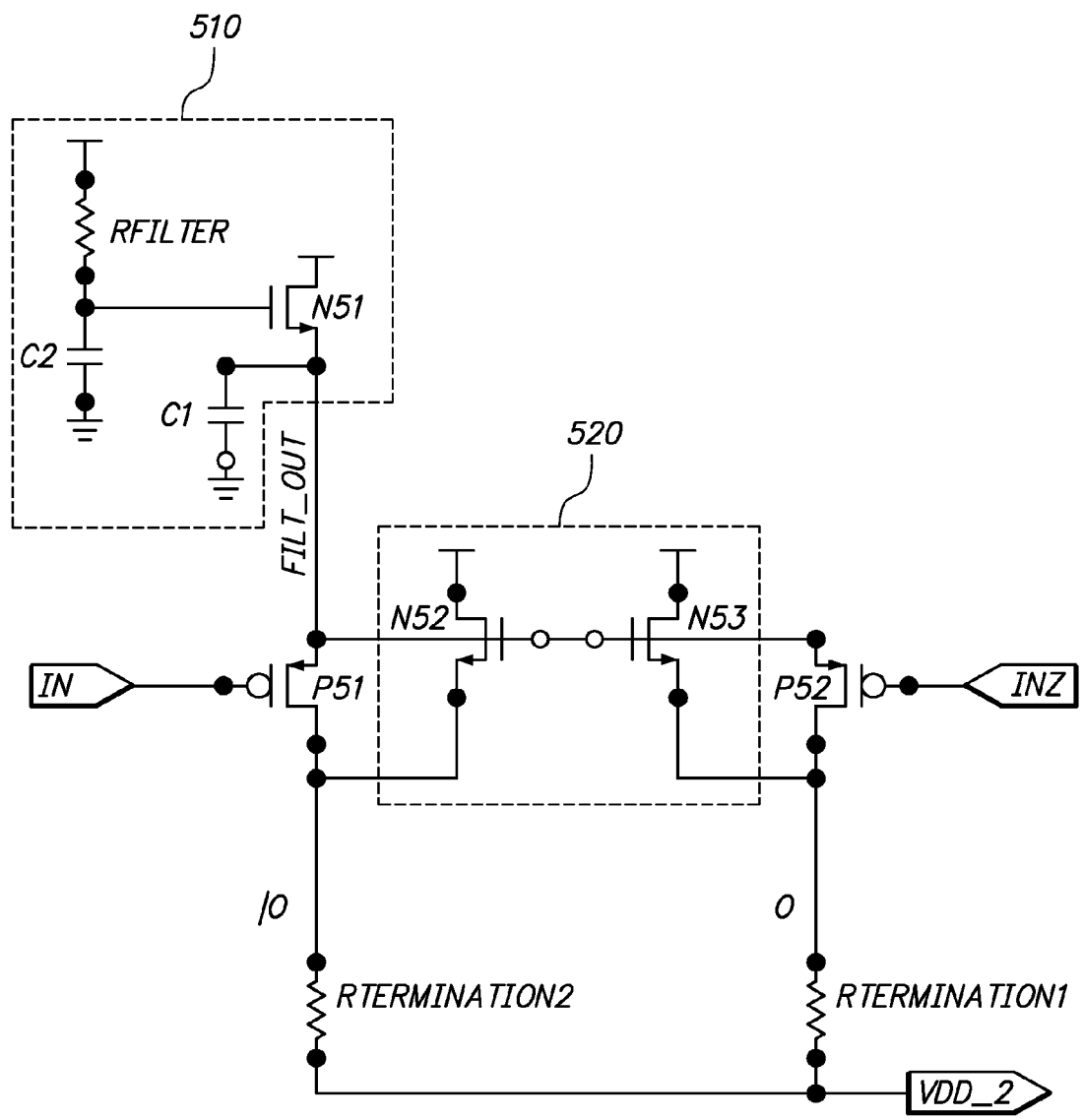
FIG. 5 is a diagram of the output stage of a supply-filtered PECL driver.

Referring now to FIG. 5, a diagram is shown of the output stage of a supply-filtered CMOS driver that provides a PECL output. The basic structure of the output stage is similar to that of FIG. 2. Transistors P51 and P52 form an input PMOS differential pair and have their drains coupled to a supply source FILT_OUT, described hereinafter. The transistor P51 has its gate connected to a non-inverted input signal IN. The transistor P52 has its gate connected to an inverted input signal INZ. Transistors P51 and P52 are sized according to the input voltages received from the predrivers. The transistors P51 and P52 have their drains coupled through respective termination resistors R2 and R1 to a voltage VDD_2 equal to VDD−2V. Output signals |O ("bar O") and O are taken at the drains of P51 and P52, which connect to the die pads. The output stage further includes an active RC supply filter 510 and a VOL clamp 520.

The active RC supply filter is formed by a large NMOS transistor N51, a resistor RFILTER, and capacitors C1 and C2. The NMOS transistor N51 is a zero or low-Vt transistor. The resistor RFILTER and die capacitor C2 are coupled in series, the resistor RFILTER being connected to VDD and the capacitor C2 being connected to ground. A node N between the resistor and the capacitor is connected to the gate of the transistor N51. The capacitor C1 is a shunt capacitor connected from the source of the transistor N51 to ground. Such an active RC filter can be used to provide approximately −30 dB of supply isolation at output frequencies of approximately 1-100 MHz, depending on the values of RFILTER and C2, as compared to approximately −8 dB without a supply filter.

When either P51 or P52 is off, the termination will tend to pull the output to VDD−2V. The VOL clamp 520 prevents this occurrence, and is formed by adding NMOS source follower clamp transistors N52 and N53 to the output pads to limit VOL to VDD−1.6V. Gates of the transistors N52 and N53 are connected to the source of the transistor P51. The transistors N52 and N53, like the transistor N51, are zero or low-Vt transistors.

Figure 6:
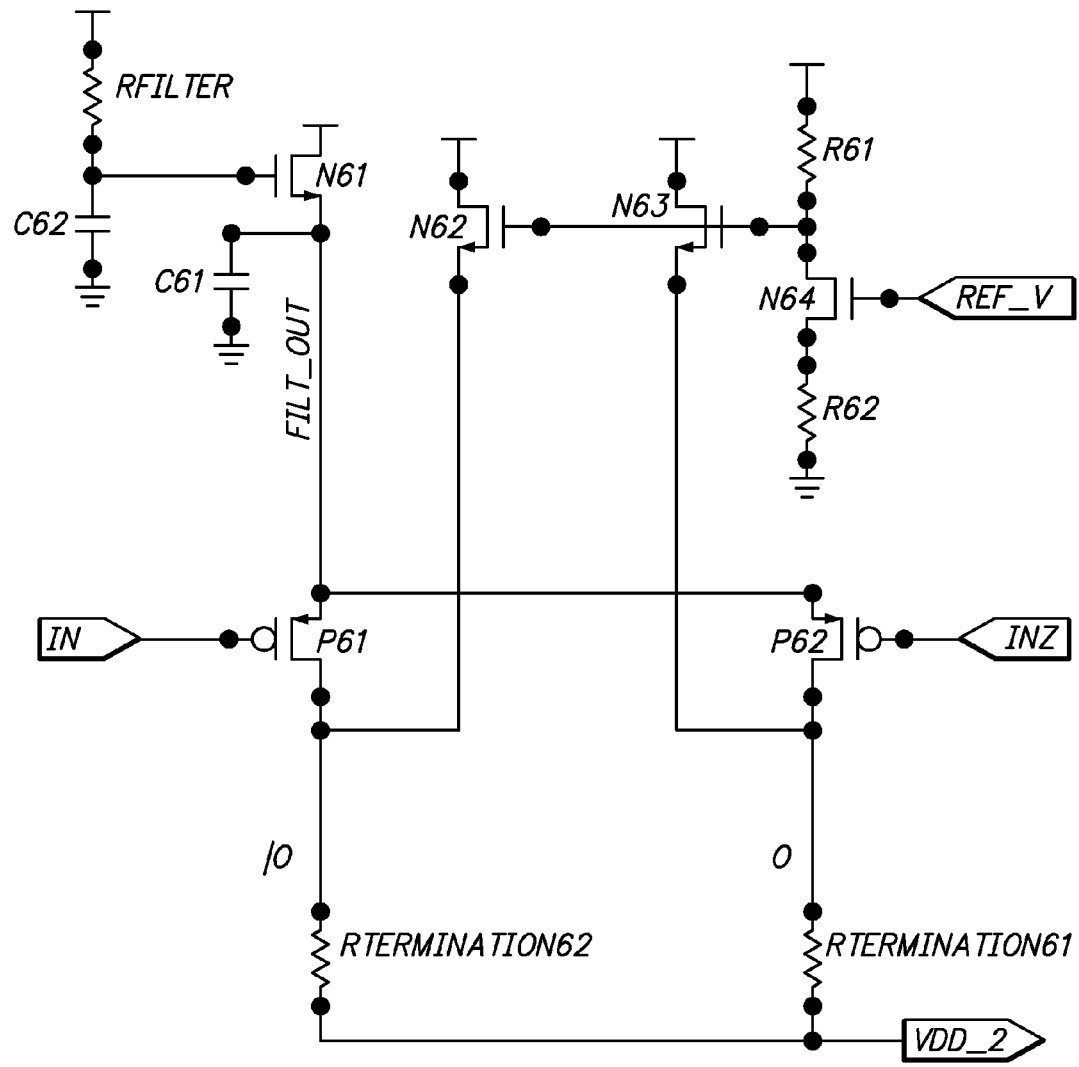
FIG. 6 is a diagram of an alternative output stage of a supply-filtered PECL driver.

Referring to FIG. 6, an alternative VOL clamping arrangement is shown. In this case, the gates of the VOL clamp transistors N62 and N63 are connected to a resistor R61 whose IR drop is connected to a current source constructed from a reference voltage REF_V, a transistor N64 and a resistor R62. The reference voltage REF_V may be provided by a bandgap or other reference voltage source. All of the transistors in FIG. 5 and FIG. 6 are thick-gate transistors.

Figure 7:
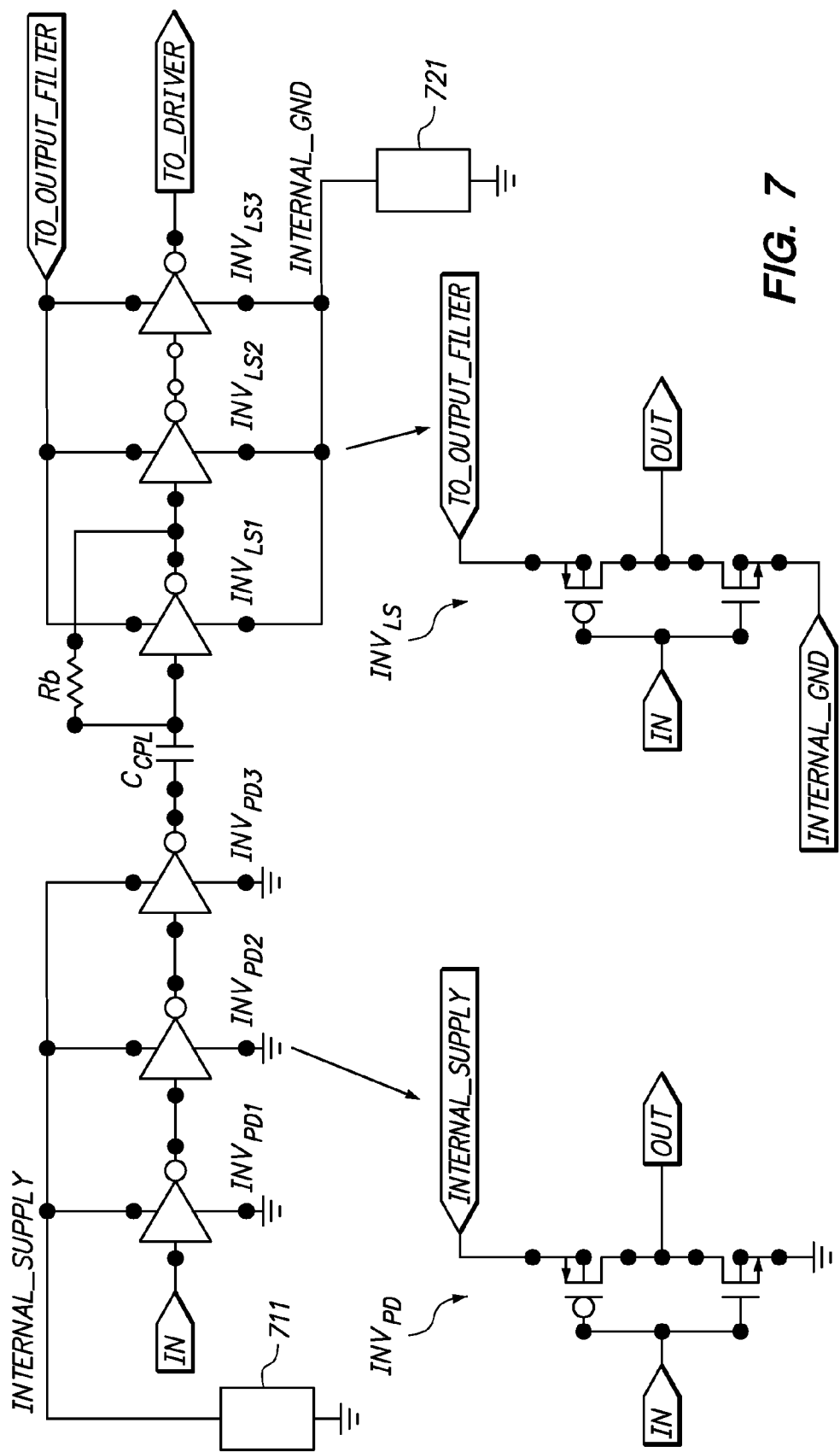
FIG. 7 is a diagram of predriver and level shifter circuits that may be used with the output stages of FIG. 5 and FIG. 6.

Referring to FIG. 7, a diagram of predriver and level shifter circuits that may be used with the output stages of FIG. 5 and FIG. 6.

In the predriver 710 and level shifter 720, no thick gate transistors are used. Rather, within the predriver 710, thin gate inverters $INV_{PD}$ connected to normal ground have are connected to a regulator 711 that produces a supply voltage INTERNAL_SUPPLY. Within the level shifter 720, thin gate inverters $INV_{LS}$ operating at high voltage VDD have their ground connected to a regulator 721 that holds the total voltage across the gates to their maximum operating voltage (2V in the case of 1.8 u technology). The voltage INTERNAL_GROUND at the internal ground is VDD−2V for a 1.8 u technology. In order for this circuit to function without having gate to bulk voltages higher than the maximum, triple well transistors (bulk isolated) are used.

In the example of FIG. 7, the predriver 710 includes three series-connected inverters $INV_{PD1}$, $INV_{PD2}$, and $INV_{PD3}$ operating at the same supply voltage (INTERNAL_SUPPLY) as the internal circuits, and two inverters operating at the high voltage VDD. The level shifter 720 includes three series-connected inverters $INV_{LS1}$, $INV_{LS2}$, and $INV_{LS3}$ operating at the high voltage VDD and elevated ground. The inverter $INV_{LS1}$ is a biased inverter having a resistor Rb connected between input and output and acts as a level translator. It provides much higher bandwidth than the typical PMOS latch translator. The first three inverters of the predriver are AC coupled to the biased inverter by capacitor Ccp1 which drives the final two inverter stages of the level shifter. Of course, the number of inverters of both the predriver 710 and the level shifter 720 may be varied.

Figures 8, 8A:
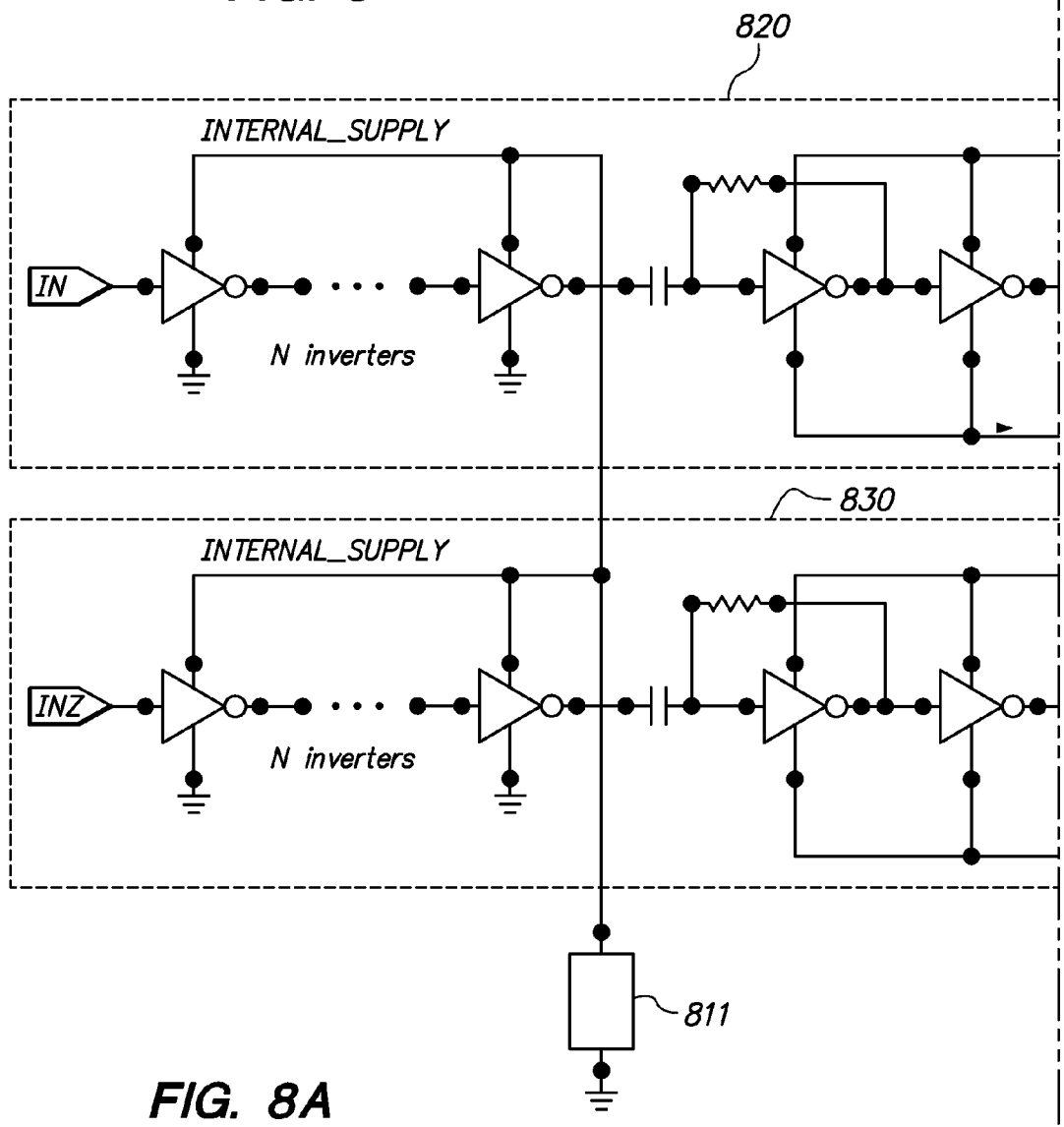
FIG. 8 is a diagram of a supply-filtered PECL driver with predriver and level shifter circuits.
Figure 8B:
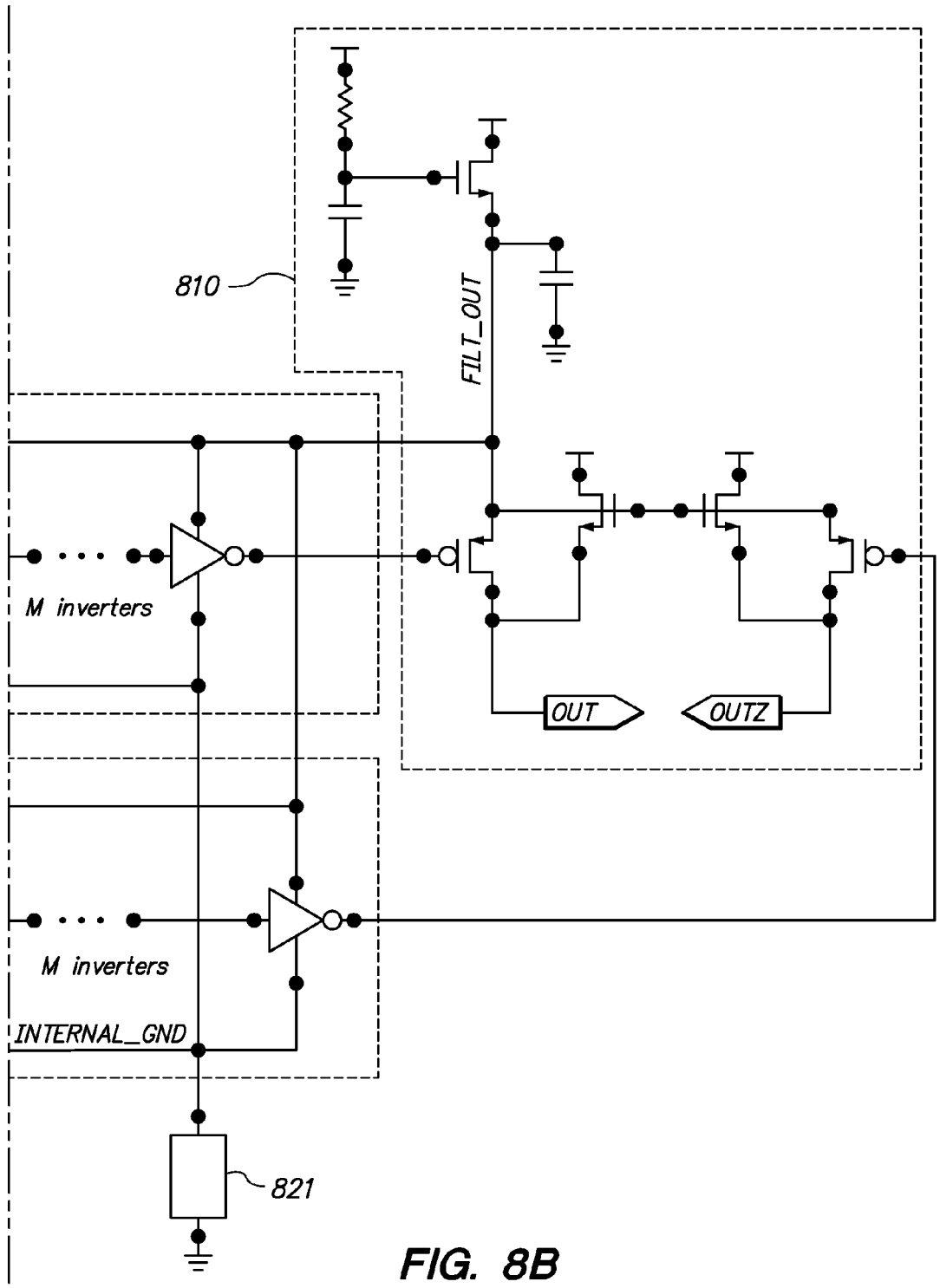

FIG. 8 shows a diagram of a supply-filtered CMOS driver that combines the output stage 810 of FIG. 5 with the pre-driver and level shifter circuits of FIG. 7. Two instances of the predriver and level shifter circuits of FIG. 7 are provided, one (820) for the true input IN and one (830) for the inverted input signal INZ. The resulting driver is compact, high-frequency and low-power and exhibits high signal integrity.

Although embodiments of the present invention have been described in detail, it should be understood that various changes, substitutions and alternations can be made without departing from the spirit and scope of the inventions as defined by the appended claims.

What is claimed is:

1. An integrated circuit output driver fabricated in a process having thin-gate MOS transistors and thick-gate MOS transistors, comprising:
   a predriver circuit comprising a plurality of series-connected inverters;
   a level shifter circuit coupled to the predriver circuit;
   a driver circuit coupled to the level shifter circuit;
   wherein the predriver circuit is formed predominantly of thin-gate transistors, and the driver circuit is formed predominantly of thick-gate transistors;
   wherein the driver circuit comprises:
   a first P transistor forming a first current path;
   a second P transistor forming a second current path; and
   a clamp circuit coupled to the first P transistor and the second P transistor.

2. The apparatus of claim 1, further comprising a low-pass power supply filter coupled to the output driver circuit.

3. The apparatus of claim 2, wherein the power supply filter is active RC power supply filter.

4. The apparatus of claim 3, wherein the power supply filter comprises an RC circuit and a source-follower transistor.

5. The apparatus of claim 1, wherein the output driver produces PECL signal levels.

6. The apparatus of claim 1, wherein the predriver circuit and the level shifter circuit are AC coupled.

7. An integrated circuit output driver, comprising:
   a predriver circuit comprising a plurality of series-connected inverters;
   a level shifter circuit coupled to the predriver circuit;
   a driver circuit coupled to the level shifter circuit;
   a low-pass power supply filter coupled to the output driver circuit;
   wherein the driver circuit comprises:
   a first P transistor forming a first current path;
   a second P transistor forming a second current path; and
   a clamp circuit coupled to the first P transistor and the second P transistor.

8. The apparatus of claim 7, wherein the integrated circuit output driver fabricated in a process having thin-gate MOS transistors and thick-gate MOS transistors, the predriver circuit being formed predominantly of thin-gate transistors, and the driver circuit being formed predominantly of thick-gate transistors.

9. The apparatus of claim 7, wherein the power supply filter is an active power supply filter.

10. The apparatus of claim 9, wherein the power supply filter comprises an RC circuit and a source-follower transistor.

11. The apparatus of claim 7, wherein the output driver produces PECL signal levels.

12. The apparatus of claim 7, wherein the predriver circuit and the level shifter circuit are AC coupled.

13. An integrated circuit output driver, comprising:
   a predriver circuit comprising a plurality of series-connected inverters;
   a level shifter circuit coupled to the predriver circuit;
   a driver circuit coupled to the level shifter circuit;
   a supply voltage input for receiving a specified supply voltage; and
   a voltage regulator circuit coupled to the supply voltage input and to at least one of the predriver circuit and the level shifter circuit, wherein an operating potential of the at least one of the predriver circuit and the level shifter circuit is less than the specified supply voltage;
   wherein the voltage regulator circuit is configured to produce an elevated ground voltage that is applied to the level shifter circuit.

14. The apparatus of claim 13, wherein the voltage regulator circuit produces a reduced internal supply voltage that is applied to the predriver circuit.

15. The apparatus of claim 13, wherein the voltage regulator circuit produces: i) a reduced internal supply voltage that is applied to the predriver circuit; and
   ii) an elevated ground voltage that is applied to the level shifter circuit.

16. The apparatus of claim 13, wherein the integrated circuit output driver fabricated in a process having thin-gate MOS transistors and thick-gate MOS transistors, the predriver circuit being formed predominantly of thin-gate transistors, and the driver circuit being formed predominantly of thick-gate transistors.

17. The apparatus of claim 13, further comprising a low-pass power supply filter coupled to the output driver circuit.

18. The apparatus of claim 17, wherein the power supply filter is an active power supply filter.

19. The apparatus of claim 18, wherein the power supply filter comprises an RC circuit and a source-follower transistor.

20. The apparatus of claim 13, wherein the output driver produces PECL signal levels.

21. The apparatus of claim 13, wherein the driver circuit comprises:
   a first P transistor forming a first current path;
   a second P transistor forming a second current path; and
   a clamp circuit coupled to the first P transistor and the second P transistor.

22. The apparatus of claim 13, wherein the predriver circuit and the level shifter circuit are AC coupled.

* * * * *